(12) United States Patent
Maslar

(10) Patent No.: US 7,373,873 B2
(45) Date of Patent: May 20, 2008

(54) LOW FRICTION, HIGH DURABILITY RINGLESS PISTON AND PISTON SLEEVE

(76) Inventor: David Maslar, 1413 Defense Hwy., Gambrills, MD (US) 20154

( * ) Notice: Subject to any disclaimer, the term of this patent is extended or adjusted under 35 U.S.C. 154(b) by 0 days.

(21) Appl. No.: 11/091,778

(22) Filed: Mar. 29, 2005

(65) Prior Publication Data

US 2005/0214540 A1  Sep. 29, 2005

Related U.S. Application Data

(60) Provisional application No. 60/557,057, filed on Mar. 29, 2004.

(51) Int. Cl.
*F01B 17/04* (2006.01)
*F16J 1/02* (2006.01)

(52) U.S. Cl. ................................. 92/155; 92/169.1

(58) Field of Classification Search ............... 92/155, 92/169.1, 222, 223; 427/248.1; 428/408
See application file for complete search history.

(56) References Cited

U.S. PATENT DOCUMENTS

| | | | |
|---|---|---|---|
| 2,992,052 A | 7/1961 | Dejohn | |
| 4,302,482 A | 11/1981 | Heck | |
| 4,466,399 A * | 8/1984 | Hinz et al. ................. | 92/169.1 |
| 4,683,809 A * | 8/1987 | Taylor ..................... | 92/208 |
| 4,724,800 A | 2/1988 | Wood | |
| 4,777,844 A | 10/1988 | DeBell et al. | |
| 4,986,234 A | 1/1991 | Bell | |
| 5,598,818 A | 2/1997 | Domanchuk | |
| 5,647,967 A | 7/1997 | Murase et al. | |
| 5,687,634 A | 11/1997 | Ransone | |
| 5,769,046 A | 6/1998 | Ransone | |
| 5,879,763 A | 3/1999 | Sugiyama et al. | |
| 5,884,550 A * | 3/1999 | Northam .................. | 92/212 |
| 5,900,193 A | 5/1999 | Rivers et al. | |
| 5,934,239 A | 8/1999 | Koriyama | |
| 5,948,330 A | 9/1999 | Rivers et al. | |
| 6,033,533 A | 3/2000 | Sugiyama et al. | |
| 6,044,819 A | 4/2000 | Rivers et al. | |
| 6,083,560 A | 7/2000 | Fisher et al. | |
| 6,116,202 A | 9/2000 | Rivers et al. | |
| 6,126,793 A | 10/2000 | Sugiyama et al. | |
| 6,135,070 A * | 10/2000 | Crandall .................. | 123/65 R |
| 6,148,785 A | 11/2000 | Rivers et al. | |
| 6,180,183 B1 | 1/2001 | Wentland et al. | |
| 6,217,952 B1 | 4/2001 | Sugiyama et al. | |

(Continued)

FOREIGN PATENT DOCUMENTS

WO   WO 0299319 A2 * 12/2002

*Primary Examiner*—Thomas E. Lazo
(74) *Attorney, Agent, or Firm*—Tangent Law Group; Eric J. Weierstall, Esq.

(57) ABSTRACT

A cylinder liner and ringless piston adapted to be combined therewith in an internal combustion engine are provided that have superior wear resistance, superior scuffing resistance, and superior properties for abating friction loss between the inside surface of the cylinder and the sliding surface of the ringless piston. These embodiments can also include a cylinder liner which has at least some portion of the inner circumferential surface coated with an iron oxide film, a metallic nitride film, or other physical vapor deposition or chemical vapor deposition film, combined with a ringless piston with at least some portion of the exterior surface being coated with a metallic nitride film or other vapor deposition film.

21 Claims, 4 Drawing Sheets

U.S. PATENT DOCUMENTS

| | | |
|---|---|---|
| 6,684,844 B1 | 2/2004 | Wang et al. |
| 6,764,714 B2 | 7/2004 | Wei et al. |
| 6,817,333 B2 | 11/2004 | Wang et al. |
| 6,941,854 B2 * | 9/2005 | Hotger et al. ............... 92/169.1 |
| 2003/0221549 A1 * | 12/2003 | Hansen et al. ................ 91/499 |
| 2004/0089260 A1 | 5/2004 | Nozaki |

* cited by examiner

| | |
|---|---|
| 1000 | placing at least one of the ringless piston and the piston sleeve in a vacuum chamber |
| 2000 | pretreating at least one of the ringless piston and the piston sleeve, e.g. sputter cleaning, chemical wash, etc. |
| 3000 | applying a process gas to the chamber at low pressure |
| 4000 | releasing ionic components of a desired thin film into the vacuum chamber |
| 5000 | attracting the desired ionic components and the process gases together to at least one of the ringless piston and piston sleeve |
| 6000 | cooling and removing at least one of the ringless piston and piston sleeve from the vacuum chamber |

Fig. 4

LOW FRICTION, HIGH DURABILITY RINGLESS PISTON AND PISTON SLEEVE

PRIORITY DATA

This application claims benefit of earlier filed U.S. Provisional Patent Application Ser. No. 60/557,057 entitled "Low Friction, High Durability Ringless Piston and Piston Sleeve" filed on Mar. 29, 2004, and is herein incorporated by reference.

TECHNICAL FIELD OF THE INVENTION

The instant invention is directed to ringless pistons and piston sleeves and combinations therein, specifically to providing a ringless piston, piston sleeves, or combinations with superior wear resistance, superior scuffing resistance, and superior properties for abating friction loss between the inside surfaces and methods of making the same.

BACKGROUND OF THE INVENTION

In recent years, considerable attention has been paid to improving the friction and wear characteristics of the sliding internal components of internal combustion engines, specifically piston rings and cylinder liners. For instance U.S. Pat. No. 5,549,086 to Ozawa, U.S. Pat. No. 5,618,590 to Naruse, et al., U.S. Pat. No. 5,743,536 to Komuro, U.S. Pat. No. 5,960,762 to Imaito, U.S. Pat. No. 6,139,984 to Onoda, et al., U.S. Pat. No. 6,315,840 to Onoda, et al., U.S. Pat. No. 6,553,957 to Ishikawa, et al., and U.S. Pat. No. 6,631,907 to Onoda, et al., touch on a wide variety of improvements in designs for ringed pistons and ringed piston cylinders and internal combustion engines. Much of this advancement has been directed to remedying the problems associated with the harsh operating conditions created by demands for higher engine output, demands created by the lightening of engine components and demands created by advancements in emission control.

One specific area of application that has not been addressed by these advancements is the operating conditions present in small displacement motors, like the small displacement glow ignition motors which are characteristically found in model cars, boats, and airplanes or small displacement motors in handheld devices like weed trimmers. These motors typically range in displacement from as small as 1 cc to 50 cc or more, with small displacement glow ignition motors generally being in the 1 cc to 10 cc range. Unlike the larger displacement engines, which typically utilize pistons and ring sets, these motors do not utilize piston rings. As a result, certain characteristics, which carry only minor significance for the larger displacement motors employing piston rings, become critical considerations in the design and operation of these small motors.

One such characteristic is the substantial power losses due to friction between the piston and the cylinder liner in a small displacement glow ignition motor. Typical pistons with rings have greater tolerances for fit and therefore friction, as the rings in the piston have a gap spacing within them allowing for an amount of travel in the ring that is not available in a ringless piston motor. The ring typically expands first in the mechanical sense, providing a tight fit around the piston at start up. The ring can then adjust when heated, providing a snug fit across all operating conditions. Moreover, in a typical ringed piston motor the friction surfaces presented by the ring are proportionately much smaller than in a ringless piston motor. The ring surrounding the piston makes the contact with the sleeve and, therefore, the losses due to friction are much smaller.

However, in a glow ignition motor because there is no piston ring that expands to seal the opening between the piston and the cylinder, the clearance between the piston and the cylinder liner must be extremely tight to insure proper compression of the air fuel mixture. In fact, the highest performance glow ignition motors will use an interference fit at or near top dead center. This extremely tight fit often necessitates pre-heating the motor to allow for a full rotation of the crank and, thereby, achieving optimal performance from the motor. Because of the tightness of the fit when the piston and engine are cold, measured power losses due to friction are substantial. The gradual increase in power can be readily seen as the engine temperature increases further increasing the clearance between piston and cylinder liner, as the liner expands faster, and decreasing the related frictional losses.

Another consideration is the catastrophic effect of wear on engine performance, especially in ringless piston engines. Because there is no expanding piston ring to allow for incremental wear on the cylinder surface, any wear at all in the ringless piston motor will result in less compression for a given operating temperature of the motor. The wear is further exacerbated by the extremely high operating speeds of these motors, which regularly exceed 40,000 revolutions per minute, as well as the aforementioned tight tolerances between piston and cylinder liner. Still another consideration is unit cost and manufacturing costs. Unlike large displacement motors typically found in passenger vehicles costing thousands of dollars or in aircraft worth millions of dollars, costs sensitivity in manufacturing these small displacement engines is significant in driving sales and marketability of the engines. Rare alloys and alloys difficult to manufacture with are cost prohibitive to use for this application.

One of the few recent developments in ringless pistons has been made by NASA as described in U.S. Pat. Nos. 5,769,046 and 6,116, 202 to Rivers, et al. These disclose an exotic carbon-carbon block and piston that can used to provide for a ringed or ringless engine. Carbon-carbon is both costly to manufacture and prohibitively difficult to work in, especially in the small dimensions required for small displacement engines, making it unsuitable for application in the small displacement motor market. Furthermore, the reference discloses that a coating can be applied, providing for instance a nickel coating on the piston skirt. There is little to suggest improved wearing low friction films or layers that might provide improved operation in a small displacement motor.

In fact, the suggested nickel coating processes is widely known in the small displacement motor industry. To confront the harsh operating environment in small displacement ringless piston motors and remain cost effective, it has become commonplace in the hobby craft industry to use a high silicon aluminum pistons coupled with brass cylinder liners possessing a hard chrome coating on the interior of the cylinder liner, commonly referred to as Aluminum, Brass, Chrome or ABC construction. The hard chrome in ABC construction is typically applied by electro-plating over the base of aluminum and brass. The hard chrome surface has improved wear characteristics over steel or cast iron, but even so has a short expected useful life. It is typical for these motors to show a measurable performance loss after only 1 gallon of fuel consumption, with many motors failing completely after 2 gallons. To date, no ringless piston or piston sleeve has been produced that takes advantage of the improved coating technologies and techniques available.

Therefore, a need exists for an improved ringless piston and/or piston sleeve that have fewer losses due to friction and increased durability over existing ringless pistons. More specifically, the need includes providing a lower coefficient of friction between the piston and the piston sleeve or motor with longer wearing surfaces to improve both engine performance and the life span through improved coating of the ringless piston and/or a piston sleeve.

BRIEF DESCRIPTION OF THE INVENTION

An object of the invention is to lower friction and increase durability in a ringless piston.

Another object of the invention is to improve engine performance in glow ignition engines.

A still further object of the invention is to improve engine performance and improve life span in small displacement engines.

The invention includes an article of manufacture, an apparatus, a method for making the article, and a method for using the article.

The apparatus of the invention includes, in an exemplary embodiment, a ringless piston with an at least one ringless piston with at least one portion of its outer surface having at least one thin film deposition layer or film. The film can be a physical vapor deposition or chemical vapor deposition film. The at least one thin film deposition layer can be an at least one of a nitride, carbide, or sulfide. The at least one thing film deposition layer can be for instance at least one of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, and C (crystalline diamond).

In a further exemplary embodiment, an at least one piston sleeve is provided with at least one portion of its outer surface with an at least one thin film deposition layer. The at least one thin film deposition layer can be formed by means of physical vapor deposition or chemical vapor deposition. The at least one thin film deposition layer can be an at least one layer of at least one of a Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, and C (crystalline diamond).

In yet another exemplary embodiment, a ringless piston and piston sleeve combination is provided having an at least one piston sleeve with at least one portion of its outer surface with an at least one thin film deposition layer and an at least one piston sleeve with at least one portion of its outer surface with an at least one thin film deposition layer. The at least one thin film deposition layer can be formed by means of physical vapor deposition or chemical vapor deposition. The at least one thin film deposition layer can be an at least one layer of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, and C (crystalline diamond)

The method of the invention includes an exemplary process of manufacturing an exterior of a ringless piston comprising the steps of providing a ringless piston with and at least one portion of an exterior surface then coating at least once through physical vapor deposition or chemical vapor deposition at least one portion of the exterior surface of the piston with an at least one film. The step of coating at least once through physical vapor deposition or chemical vapor deposition can include coating through physical vapor deposition or chemical vapor deposition at least once through ion plating, vacuum deposition, laser alloying, and sputtering. The step of coating at least once through physical vapor deposition or chemical vapor deposition said at least one portion of the exterior surface of the piston with an at least one film can further include coating at least once with an at least one layer of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, and W—C alloy, C (crystalline diamond). The step of coating at least once through physical vapor deposition or chemical vapor deposition said at least one portion of the exterior surface of the piston with an at least one film can also include the step of coating with a plurality of coatings with an at least one layer of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, and W—C alloy, C (crystalline diamond).

The process of the invention includes an exemplary process of manufacturing at least one of a ringless piston and a piston sleeve, including the steps of causing an arc discharge in a process gas atmosphere comprised of nitrogen or carbon as a component element, using as a cathode a target comprised of a metal not capable of forming a carbide or nitride and a metal capable of forming a carbide or nitride, to release ions from said target; and applying a bias voltage to a ringless piston to be coated, to bring said metal ions, together with process gas particles, into adhesion to the surface of the ringless piston to form thereon a dense hard film. The process of coating with a film is by the method of physical vapor deposition or chemical vapor deposition.

In yet another exemplary embodiment, a ringless piston and cylinder liner combination for internal combustion engines manufactured by a process of chemical vapor deposition or physical vapor deposition is provided and has an at least one engine block or cylinder liner with an at least one portion of its inner surface having a physical vapor deposition or chemical vapor deposition film and includes an at least one ringless piston formed on its whole or in at least one portion of its outer surface with a physical vapor deposition or chemical vapor deposition film.

The article of manufacture of the invention includes a ringless piston and cylinder liner combination for internal combustion engines, having an at least one cylinder liner with an at least one portion of its inner surface having a physical vapor deposition or chemical vapor deposition film and an at least one ringless piston formed on its whole or in at least one portion of its outer surface with a physical vapor deposition or chemical vapor deposition film. The physical vapor deposition or chemical vapor deposition can be conducted by a method from the group consisting of ion plating, vacuum deposition, laser alloying, and sputtering. The physical vapor deposition or chemical vapor deposition film can be selected from the group consisting of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, C (crystalline diamond).

The physical vapor deposition or chemical vapor deposition film can also be a composite comprising a plurality of layers of physical vapor deposition or chemical vapor deposition films. The plurality of layers of the physical vapor deposition or chemical vapor deposition films can be selected from the group consisting of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, C (crystalline diamond).

A still further exemplary embodiment of an article of the instant invention can be a ringless piston and cylinder liner combination where the physical vapor deposition or chemical vapor deposition film is a plurality of layers of physical vapor deposition or chemical vapor deposition films and additional films or substrates. The vapor deposition film being at least one of a carbide, nitride, or sulfide. The physical vapor deposition or chemical vapor deposition film further being selected from at least one of the group consisting of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, C (crystalline diamond).

Still another exemplary embodiment of an article of the instant invention provides a ringless piston and cylinder liner combination according where the physical vapor deposition or chemical vapor deposition film is a composite comprising of more than one layer of physical vapor deposition or chemical vapor deposition films. The physical vapor deposition or chemical vapor deposition an at least one film of the composite film can be selected from the group consisting of Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, C (crystalline diamond).

Moreover, the above objects and advantages of the invention are illustrative, and not exhaustive, of those that can be achieved by the invention. Thus, these and other objects and advantages of the invention will be apparent from the description herein, both as embodied herein and as modified in view of any variations that will be apparent to those skilled in the art.

BRIEF DESCRIPTION OF THE DRAWINGS

Embodiments of the invention are explained in greater detail by way of the drawings, where the same reference numerals refer to the same features.

FIG. 4 is flow chart of an exemplary embodiment of the method of manufacture of the instant invention.

DETAILED DESCRIPTION OF THE INVENTION

The present invention improves the performance of the aforementioned motors by lowering the frictional losses and increasing the component durability. This is achieved through the application of a more durable and lower friction surface to the piston and cylinder liner than the currently available ABC construction. One class of surfaces that meets the above characteristics are the group of thin film coatings typically formed through the processes of physical vapor deposition and chemical vapor deposition. These films generally offer a substantial improvement over aluminum and hard chrome in both hardness and wear resistance as well as substantially decreased coefficients of friction.

Typical physical vapor deposition (PVD) or chemical vapor deposition (CVD) methods include ion plating, vacuum deposition, laser alloying, sputtering and similar process for depositing thin films on substrates.

Figure 1:
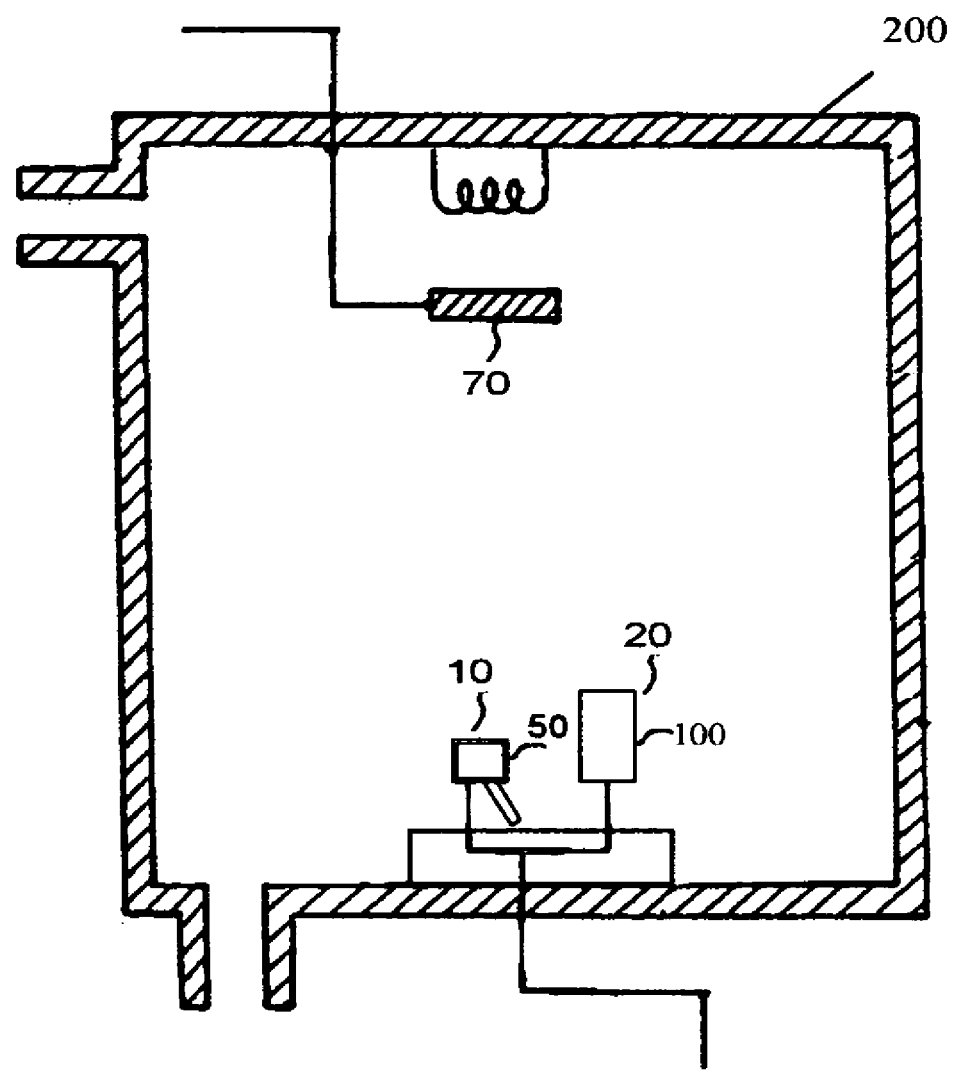
FIG. 1 shows an exemplary embodiment of a method of applying a thin film vapor deposition layer in the instant invention.

For instance, one non-limiting example of a PVD process is ion plating (IP). FIG. 1 shows an exemplary embodiment of a method of applying a thin film vapor deposition layer in the instant invention. In the ion-plating exemplary embodiment shown, the ringless piston 10 and/or piston sleeve or cylinder liner 20 to be coated and the source of the coating material are held in a vacuum chamber 200 within a low-pressure gaseous environment. Typically, prior to being coated with the source material, the item is "sputter cleaned." Energetic ions (electrically charged atoms) and neutral atoms of an activated inert gas strike the surface of the item to remove contaminants. Sputter cleaning is desirous in ion plating because it produces a very reactive and atomically clean surface, however other preparation methods may be utilized without departing from the spirit of the invention.

The IP process provides for deposition of a low friction film 50, 100 of a particular low friction material on a surface, in this case an at least one portion of the ringless piston 10 and/or piston sleeve 20. The IP process causes an arc discharge in a process gas atmosphere. The atmosphere typically comprises nitrogen or carbon as a component element, but can be varied to suit specific manufacturing tolerances and requirements. The process causes the arc discharge using a cathode target 70 comprised of a metal not capable of forming a carbide or nitride and a metal capable of forming a carbide or nitride, thus releasing the metal ions from the target. By applying a bias voltage to the ringless piston 10 and/or piston sleeve 20 the metal ions are brought together with the process gas particles and adhere to the surface of the ringless piston 10 or cylinder liner 20 to form a dense hard film of the particular low friction materials 50,100. The IP process can be used to deposit a variety of coatings—metals, metal alloys, ceramics, and metal/ceramic composites. It provides excellent adhesion between the coating and the surface. The IP process also provides a coating with a relatively uniform thickness over the entire surface of the specimen. A uniform coating can even be applied to irregularly shaped items without extensive manipulation. Finally, ion plating requires little or no heating of the item to be coated. However, similar processing via vacuum deposition, sputtering, laser alloying and other PVD and CVD processes would provide for similar films or coatings on the ringless piston and/or cylinder liner and would be equally useful in the instant invention. These would of course be known to one of ordinary skill in the art and employing them to coat a ringless piston and/or piston sleeve would be well within the scope of the instant invention.

Typical PVD or CVD films can include, but are not limited too, carbides, nitrides, and sulfides. For example, Cr—N alloy, Cr—B—N alloy, Ti—N alloy, Cr—V—B—N alloy, Zr—N alloy, Ti—Al—N alloy, Al—Ti—N alloy, Ti—C—N alloy, Mo—S alloy, Cr—C alloy, Ti—C alloy, Si—C alloy, Al—O alloy, Si—N alloy, W—C alloy, C (crystalline diamond) or similar alloys that can result from a vapor deposition process would be suitable for use with the instant invention.

Figure 2:
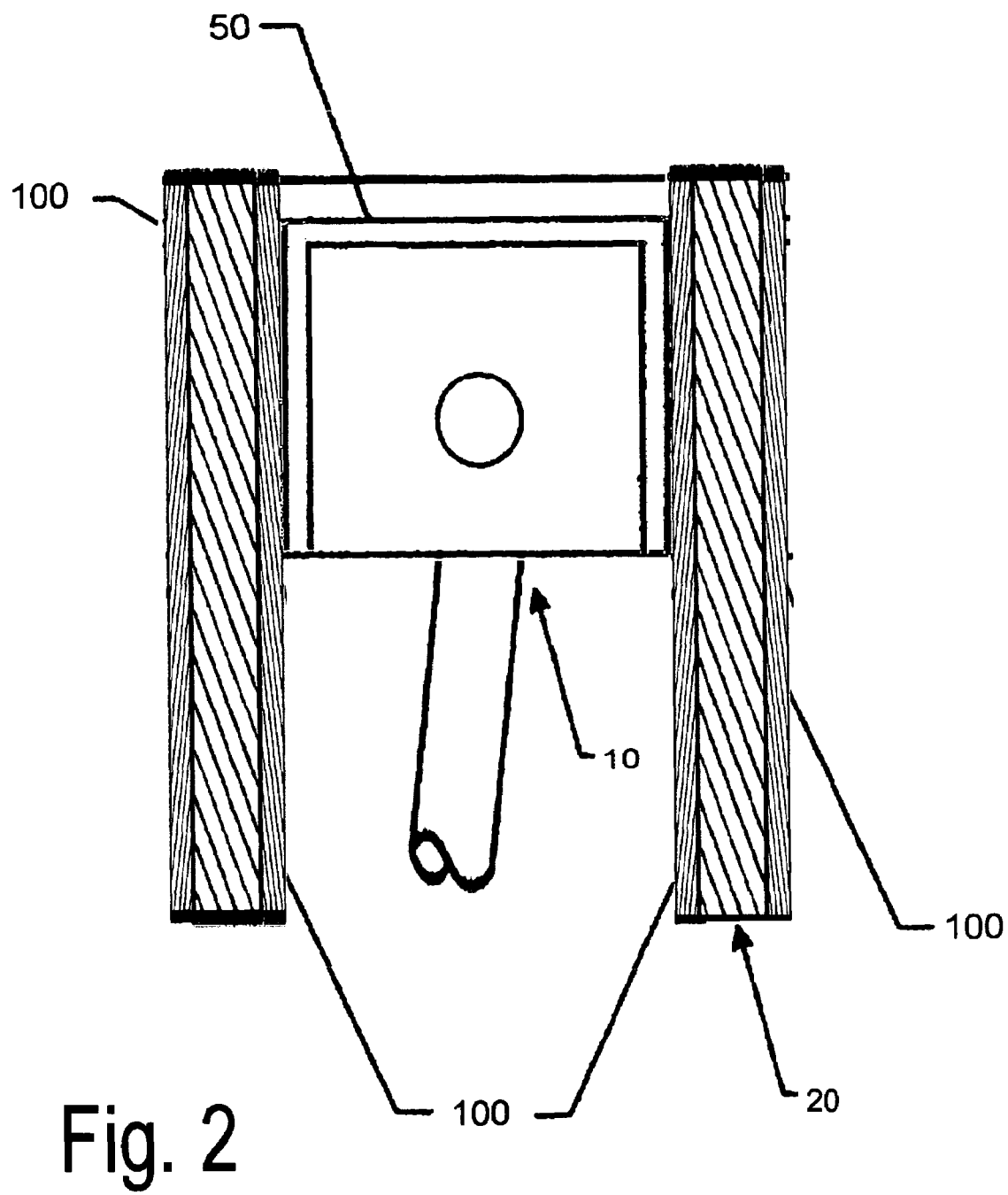
FIG. 2 is a sectional view of an exemplary embodiment of the invention with a single vapor deposition layer.

FIG. 2 is a sectional view of an exemplary embodiment of the invention with a single vapor deposition layer. The application of the PVD/CVD film 50 is made to the exterior surfaces of the ringless piston 10. The application can be made to a portion of the ringless piston and/or sleeve, as shown with respect to the film 50 on ringless piston 10, or the entire part may be coated with the film, as shown with respect to the film 100 on piston sleeve 20. In an exemplary embodiment, the film 50 is specifically deposited at a point where the ringless piston 10 comes into contact with the cylinder liner 20, although as mentioned in further embodiments the entire surface of the piston 10 and/or sleeve 20 can be coated. The PVD/CVD coated ringless piston 10 can also be used in conjunction with a cylinder liner 20, which has been coated on at least the interior walls by hard chrome, iron oxide film, or, in an exemplary embodiment, also in a PVD/CVD film as shown.

Figure 3:
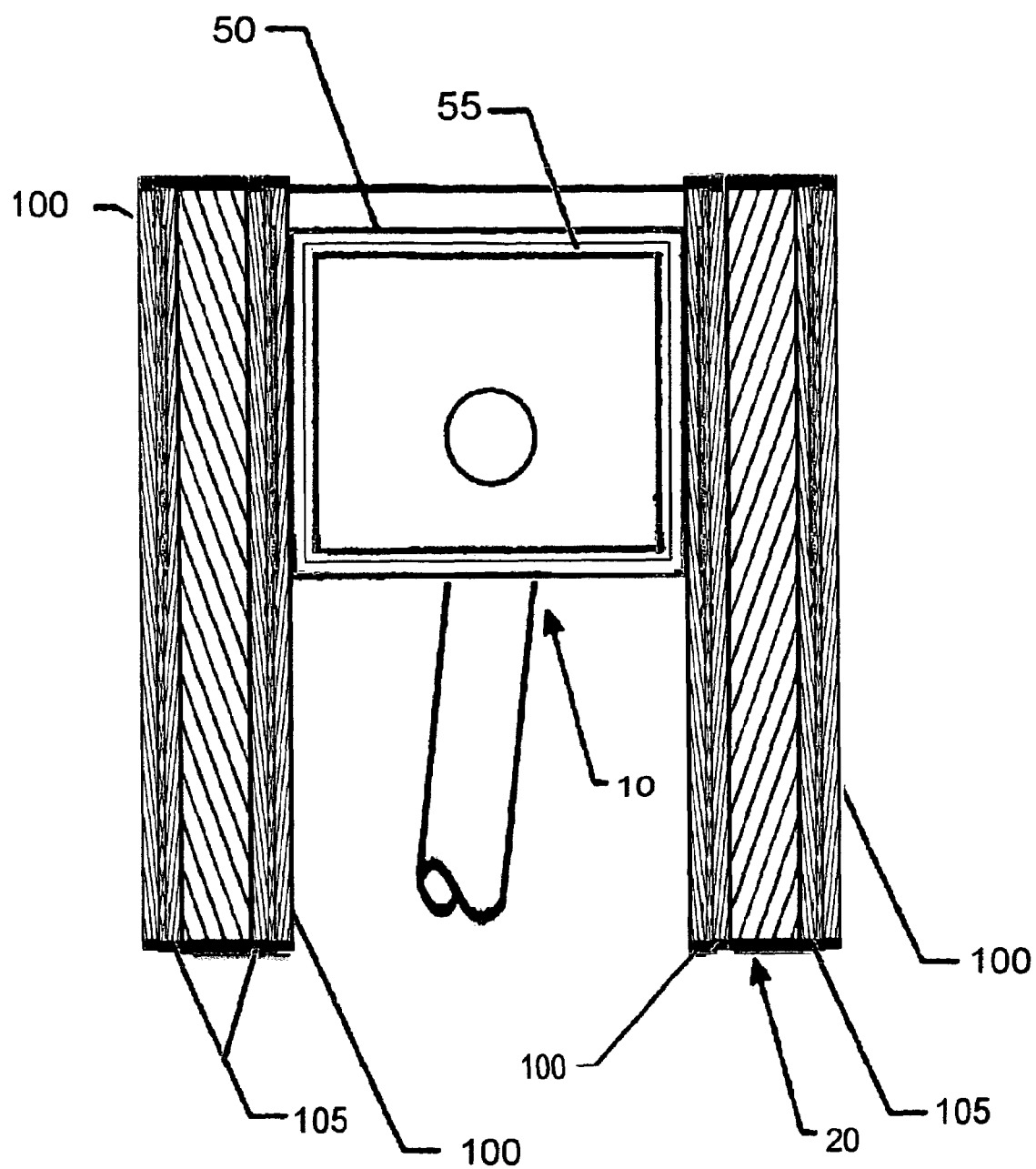
FIG. 3 is a sectional view of an exemplary embodiment of the invention with a multiple layers.

FIG. 3 is a sectional view of an exemplary embodiment of the invention with a multiple layers. In this further exemplary embodiment of the invention, a ringless piston 10 formed of an alloy of aluminum or steel is fully coated with a film composed of Titanium Aluminum Nitride/Tungsten Carbide/Carbon (TiAlN/WC/C). The cylinder liner 20, in this exemplary embodiment, is coated on the interior surfaces with AlTiN. A substrate preparation layer is provided 55, 105 on both the ringless piston 10 and piston sleeve 20. Other appropriate films may be utilized in further exemplary embodiments. The films may be varied in thickness and multiple layers may be combined with any appropriate films. Similarly, the substrate may be pretreated by any conventional pretreatment process and layers, coatings, or films may be added as substrate for the PVD/CVD films without departing from the spirit of the invention.

FIG. 4 shows a flow chart of an exemplary embodiment of the method of manufacture of the instant invention. In the method of manufacture of the instant invention, in a first step 1000 the piston and/or the piston sleeve are placed in a vacuum chamber and mounted in a jig within the vacuum chamber. In an optional pre-treatment step 2000, the ringless piston and/or piston sleeve may be pretreated through any appropriate pretreatment means, for example through sputter cleaning or through a chemical wash. In step 3000, a process gas is applied to the chamber at low pressures. In a release step 4000, an electrical arc or similar mechanism causes metallic ions to be freed within the vacuum chamber, typically from a target comprising the desired material. In step 5000, a suitable method is used to attract the metal ions and the process gases to the ringless piston and/or piston sleeve, typically an electrical bias or magnetic field is applied to or around the ringless piston and/or piston sleeve. Step 6000, the ringless piston and/or piston sleeve is cooled and removed from the vacuum chamber.

The combination of coatings and films on the wear surfaces of the piston and cylinder liner will provide for greatly reduced friction as well as enhanced wear resistance. These benefits will allow for tighter tolerances in the component design as well as more power and greatly improved engine life.

The invention is described in detail with respect to preferred embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

What is claimed is:

1. A small displacement internal combustion engine ringless piston manufactured by the process comprising:
   providing an at least one ringless piston;
   coating said ringless piston on an at least one portion of its outer surface with an at least one low friction, thin film deposition layer, wherein the at least one low friction, thin film deposition layer is a composite comprising a combination of at least one of an at least one low friction film layer deposited from physical vapor deposition or chemical vapor deposition of the low friction films, additional films, and substrates; and
   installing said ringless piston in a small displacement internal combustion engine.

2. The ringless piston of claim 1, wherein the at least one low friction, thin film deposition layer is an at least one layer of Cr-N alloy, Cr-B-N alloy, Ti-N alloy, Cr-V-B-N alloy, Zr-N alloy, Ti-Al-N alloy, Al-Ti-N alloy, Ti-C-N alloy, Mo-S ahoy, Cr-C alloy, Ti-C alloy, Si-C alloy, Al-O alloy, Si-N alloy, W-C alloy, and C (crystalline diamond).

3. A small displacement internal combustion engine piston sleeve manufactured by the process comprising:
   providing an at least one piston sleeve;
   coating at least one portion of said piston sleeve with an at least one low friction, thin film deposition layer, where the at least one low friction, thin film deposition layer is a composite comprising a combination of at least one of a low friction film, an additional film, and a substrate with an at least one of a low friction film, an additional film, and a substrate; and
   installing said piston sleeve in a small displacement internal combustion engine.

4. The piston sleeve of claim 3, wherein the at least one low friction, thin film deposition layer is formed by physical vapor deposition or chemical vapor deposition.

5. The piston sleeve of claim 4, wherein the at least one thin film deposition layer is an at least one layer of Cr-N alloy, Cr-B-N alloy, Ti-N alloy, Cr-V-B-N ahoy, Zr-N ahoy, Ti-Al-N alloy, Al-Ti-N alloy, Ti-C-N alloy, Mo-S alloy, Cr-C alloy, Ti-C alloy, Si-C alloy, Al-O alloy, Si-N alloy, W-C alloy, and C (crystalline diamond).

6. A ringless piston and piston sleeve combination comprising:
   an at least one piston sleeve with at least one portion of its outer surface with an at least one low friction, thin film deposition layer; and
   an at least one piston sleeve with at least one portion of its inner surface with an at least one low friction, thin film deposition layer.

7. The ringless piston and piston sleeve combination of claim 6, wherein the at least one thin film deposition layer is formed by physical vapor deposition or chemical vapor deposition.

8. The ringless piston and piston sleeve combination of claim 7, wherein the at least one thin film deposition layer is an at least one layer of Cr-N alloy, Cr-B -N alloy, Ti-N alloy, Cr-V-B-N alloy, Zr-N alloy, Ti-Al-N alloy, Al-Ti-N alloy, Ti-C-N alloy, Mo-S alloy, Cr-C alloy, Ti-C alloy, Si-C alloy, Al-O alloy, Si-N alloy, W-C alloy, and C (crystalline diamond).

9. A small displacement internal combustion engine ringless piston and piston sleeve combination, comprising:
   an at least one small displacement internal combustion engine piston sleeve with an at least one portion of an inner surface of said piston sleeve having a low friction physical vapor deposition or chemical vapor deposition film, wherein the physical vapor deposition or chemical vapor deposition low friction film is a composite comprising a combination of at least one of a plurality of layers of physical vapor deposition or chemical vapor deposition of low friction films, additional films, and substrates; and an at least one small displacement internal combustion engine ringless piston having on its whole or on at least one portion of its outer surface a low friction physical vapor deposition or chemical vapor deposition film.

10. ringless piston and piston sleeve combination according to claim 9, wherein the physical vapor deposition or chemical vapor deposition low friction film is conducted by at least one of ion plating, vacuum deposition, laser alloying, and sputtering.

11. The ringless piston and piston sleeve combination according to claim 10, wherein the physical vapor deposition or chemical vapor deposition low friction film is comprised of one of an at least one carbide, nitride or sulfide.

12. The ringless piston and piston sleeve combination according to claim 11, wherein the physical vapor deposition or chemical vapor deposition low friction film is selected from at least one of the group consisting of Cr-N alloy, Cr-B-N alloy, Ti-N alloy, Cr-V-B-N alloy, Zr-N alloy, Ti-Al-N alloy, Al-Ti-N alloy, Ti-C-N alloy, Mo-S alloy, Cr-C alloy, Ti-C alloy, Si-C alloy, Al-O alloy, Si-N alloy, W-C alloy, and C (crystalline diamond).

13. The ringless piston and piston sleeve combination according to claim 9, wherein an at least one of the plurality of layers of physical vapor deposition or chemical vapor deposition low friction films is comprised of an at least one carbide, nitride or sulfide.

14. The ringless piston and piston sleeve combination according to claim 13, wherein at least one of the plurality of physical vapor deposition or chemical vapor deposition low friction films is selected from at least one of the group consisting of Cr-N alloy, Cr-B-N alloy, Ti-N alloy, Cr-V-B-N alloy, Zr-N alloy, Ti-Al-N alloy, Al-Ti-N alloy, Ti-C-N alloy, Mo-S alloy, Cr-C alloy, Ti-C alloy, Si-C alloy, Al-O alloy, Si-N alloy, W-C alloy, and C (crystalline diamond).

15. The ringless piston and piston sleeve combination according to claim 14, wherein the physical vapor deposition or chemical vapor deposition low friction film is conducted by at least one of ion plating, vacuum deposition, laser alloying, and sputtering.

16. A small displacement internal combustion engine ringless piston, comprising:

a small displacement internal combustion engine ringless piston formed on its whole or on at least one portion of its outer surface with an at least one low friction, thin film deposition layer, wherein the at least one low friction, thin film deposition layer is a composite comprising a combination of at least one of an at least one low friction, thin film layer deposited from physical vapor deposition or chemical vapor deposition of the low friction films, additional films, and substrates.

17. The ringless piston according to claim 16, wherein the composite comprising a combination of at least one of an at least one low friction, thin film layer deposited from physical vapor deposition or chemical vapor deposition of the low friction films further comprises an at least one physical vapor deposition or chemical vapor deposition films is conducted by at least one of ion plating, vacuum deposition, laser alloying, and sputtering.

18. The ringless piston according to claim 17, wherein the low friction physical vapor deposition or chemical vapor deposition film is at least one of a carbide, nitride, or sulfide.

19. The ringless piston according to claim 18, wherein the physical vapor deposition or chemical vapor deposition low friction film is selected from at least one of the group consisting of Cr-N alloy, Cr-B-N alloy, Ti-N alloy, Cr-V-B-N alloy, Zr-N alloy, Ti-Al-N alloy, Al-Ti-N alloy, Ti-C-N alloy, Mo-S alloy, Cr-C alloy, Ti-C alloy, Si-C alloy, Al-O alloy, Si-N alloy, W-C alloy, C (crystalline diamond).

20. The ringless piston according to claim 18, wherein the at least one physical vapor deposition or chemical vapor deposition film is at least one film chosen from the group consisting of Cr-N alloy, Cr-B-N alloy, Ti-N alloy, Cr-V-B-N alloy, Zr-N alloy, Ti-Al-N alloy, Al-Ti-N alloy, Ti-C-N alloy, Mo-S alloy, Cr-C alloy, Ti-C alloy, Si-C alloy, Al-O alloy, Si-N alloy, W-C alloy, and C (crystalline diamond).

21. A small displacement internal combustion engine ringless piston and piston sleeve combination, comprising:

an at least one small displacement internal combustion engine piston sleeve with an at least one portion of an inner surface of said piston sleeve having a low friction layer, wherein the low friction layer is a layer of at least one of chrome, iron oxide film, nickel, and nickel based alloy; and an at least one small displacement internal combustion engine ringless piston having on its whole or on at least one portion of its outer surface a low friction physical vapor deposition or chemical vapor deposition film.

* * * * *